(12) United States Patent
Shidara

(10) Patent No.: US 9,922,798 B2
(45) Date of Patent: Mar. 20, 2018

(54) SAMPLE PROCESSING METHOD AND CHARGED PARTICLE BEAM DEVICE

(71) Applicant: Hitachi High-Technologies Corporation, Minato-ku, Tokyo (JP)

(72) Inventor: Takashi Shidara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/307,206

(22) PCT Filed: May 9, 2014

(86) PCT No.: PCT/JP2014/062456
§ 371 (c)(1),
(2) Date: Oct. 27, 2016

(87) PCT Pub. No.: WO2015/170397
PCT Pub. Date: Nov. 12, 2015

(65) Prior Publication Data
US 2017/0047196 A1    Feb. 16, 2017

(51) Int. Cl.
*H01J 37/30*    (2006.01)
*H01J 37/295*    (2006.01)
(Continued)

(52) U.S. Cl.
CPC .......... *H01J 37/244* (2013.01); *H01J 37/26* (2013.01); *H01J 37/28* (2013.01); *H01J 37/317* (2013.01)

(58) Field of Classification Search
USPC .... 250/306, 307, 309, 310, 311, 492.3, 526; 702/134, 155, 170, 172
See application file for complete search history.

(56) References Cited

U.S. PATENT DOCUMENTS

| 8,674,301 B2 * | 3/2014 | Takagi | G02B 21/0004 250/306 |
| 8,822,921 B2 * | 9/2014 | Schmidt | G01N 1/286 250/306 |

(Continued)

FOREIGN PATENT DOCUMENTS

| JP | 2000-321224 A | 11/2000 |
| JP | 2009-26621 A | 2/2009 |

(Continued)

OTHER PUBLICATIONS

Suzuki, S., "Evaluation of Transmission-EBSD Method and Its Application to Observation of Microstructures of Metals", J. Japan Inst. Met. Mater., 2013, vol. 77, No. 7, pp. 268-275 with partial English translation (Eight (8) pages).

(Continued)

*Primary Examiner* — Bernard Souw
(74) *Attorney, Agent, or Firm* — Crowell & Moring LLP

(57) ABSTRACT

The present invention provides, in the preparation of a TEM or STEM sample using FIB-SEM, a technique for obtaining a processing end point on the back surface side of the sample. The state of the sample back surface being processed by the FIB is detected using a Kikuchi pattern formed when electrons that have been injected by the SEM are emitted from the sample back surface. Since this Kikuchi pattern is caused by the crystal structure of the sample back surface, the crystal orientation relative to the injected electron beam, and the crystal lattice constants, detecting the pattern allows the processing end point on the back surface side to be obtained during the FIB processing.

13 Claims, 15 Drawing Sheets

(51) Int. Cl.
*H01J 37/31* (2006.01)
*H01J 37/244* (2006.01)
*H01J 37/26* (2006.01)
*H01J 37/28* (2006.01)
*H01J 37/317* (2006.01)

(56) References Cited

U.S. PATENT DOCUMENTS

| | | | | |
|---|---|---|---|---|
| 8,912,490 B2* | 12/2014 | Kelley | ............... | G01N 1/32 250/306 |
| 2009/0020698 A1 | 1/2009 | Muto et al. | | |
| 2010/0116977 A1 | 5/2010 | Young et al. | | |
| 2011/0220796 A1 | 9/2011 | Nicolopoulos et al. | | |
| 2012/0001070 A1* | 1/2012 | Takagi | ............... | G02B 21/0004 250/310 |
| 2012/0298884 A1* | 11/2012 | Nakajima | ............... | H01J 37/20 250/453.11 |
| 2013/0277552 A1* | 10/2013 | Nanri | ............... | H01J 37/304 250/307 |
| 2013/0309776 A1* | 11/2013 | Drndic | ............... | G01N 27/26 436/94 |
| 2016/0020061 A1* | 1/2016 | Ikarashi | ............... | H01J 35/08 378/64 |

FOREIGN PATENT DOCUMENTS

| | | |
|---|---|---|
| JP | 2012-507728 A | 3/2012 |
| JP | 2012-507838 A | 3/2012 |
| JP | 2012-138283 A | 7/2012 |

OTHER PUBLICATIONS

International Search Report (PCT/ISA/210) issued in PCT Application No. PCT/JP2014/062456 dated Jun. 10, 2014 with English translation (Four (4) pages).

Japanese-language Written Opinion (PCT/ISA/237) issued in PCT Application No. PCT/JP2014/062456 dated Jun. 10, 2014 (Three (3) pages).

* cited by examiner

[FIG. 1A]
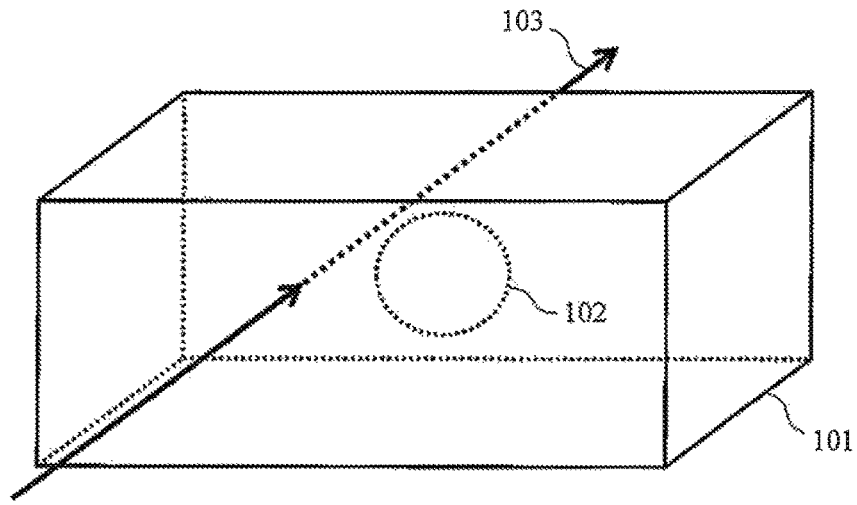
[FIG. 1B]
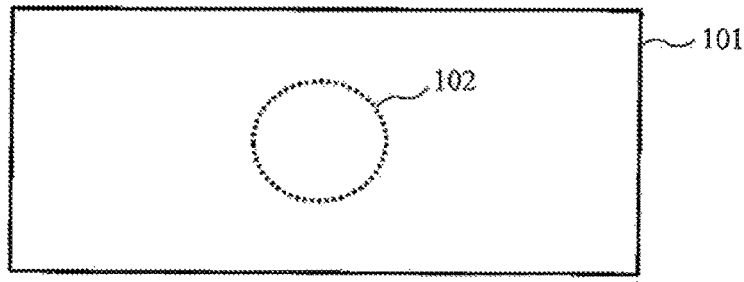
[FIG. 1C]
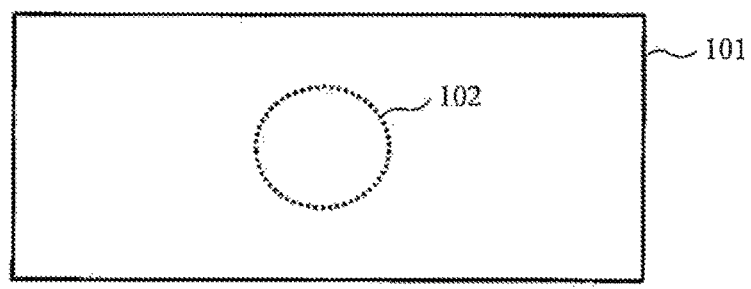

[FIG. 1D]
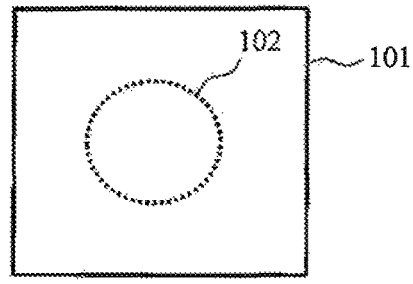
[FIG. 2]
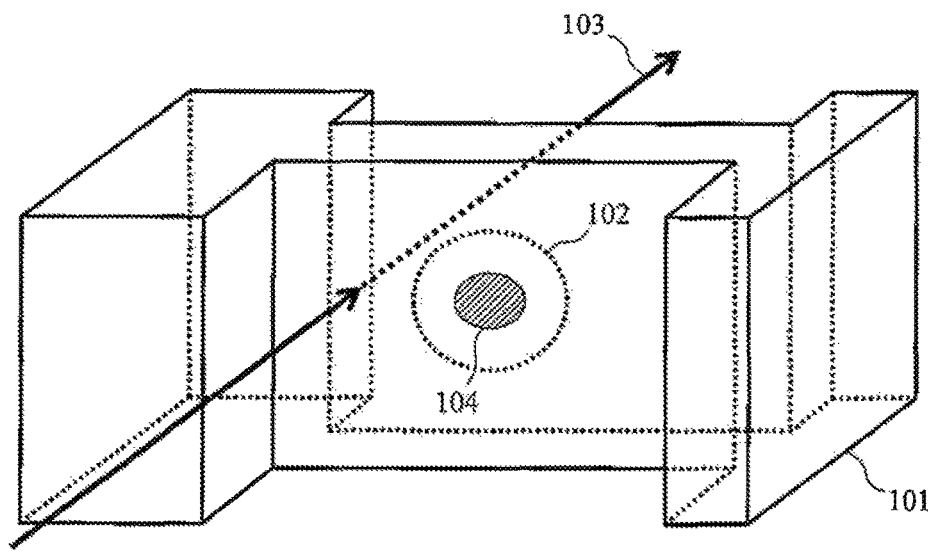

[FIG. 3A]
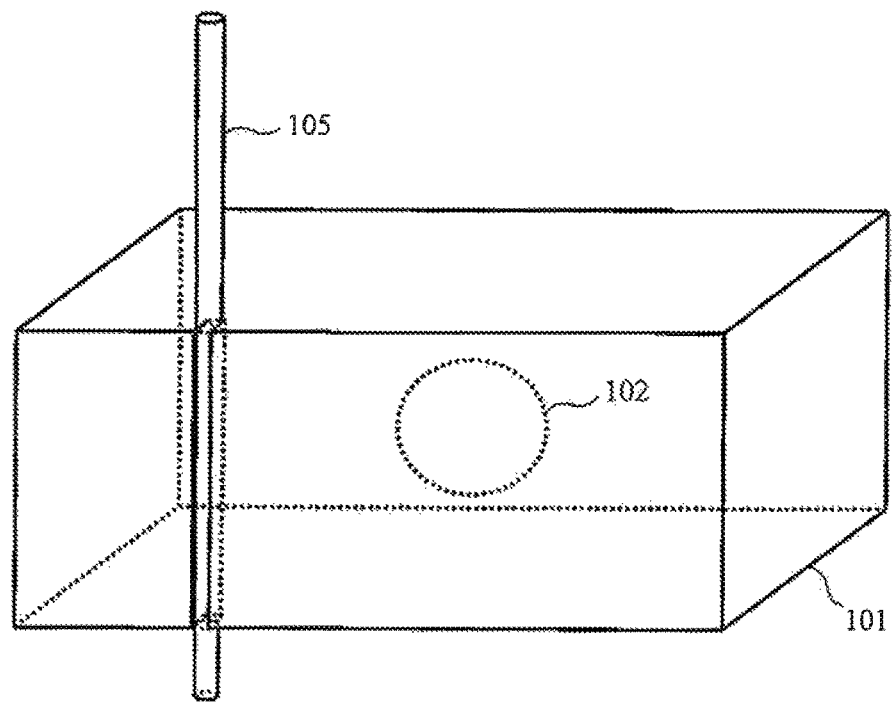
[FIG. 3B]
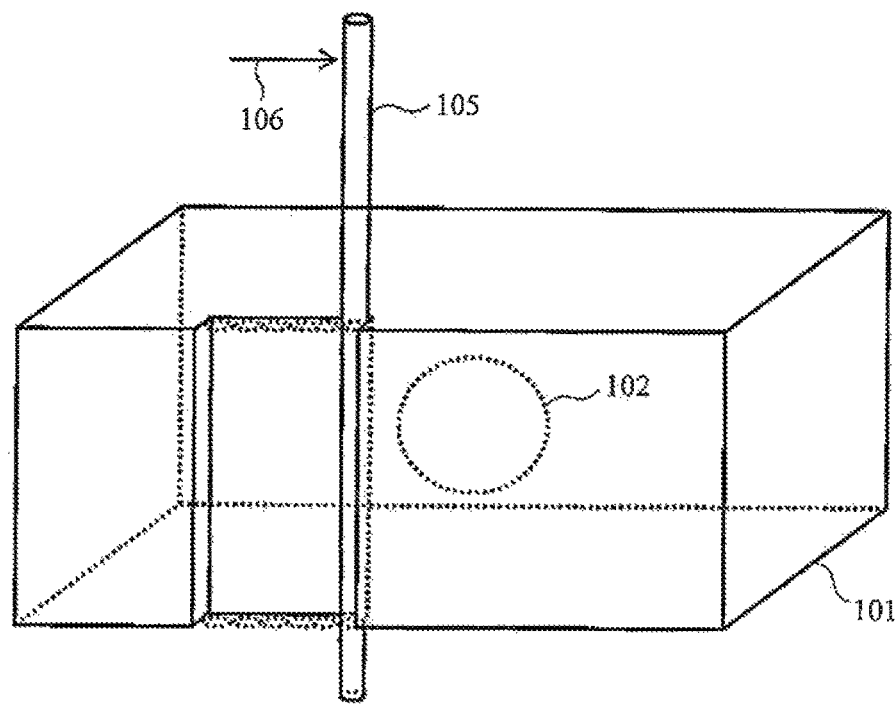

[FIG. 3C]
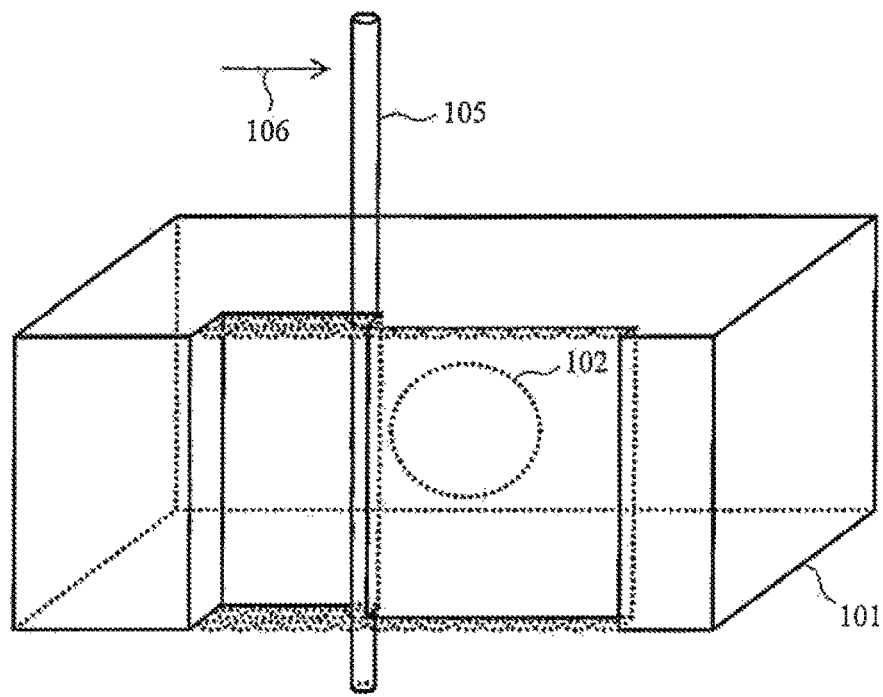
[FIG. 3D]
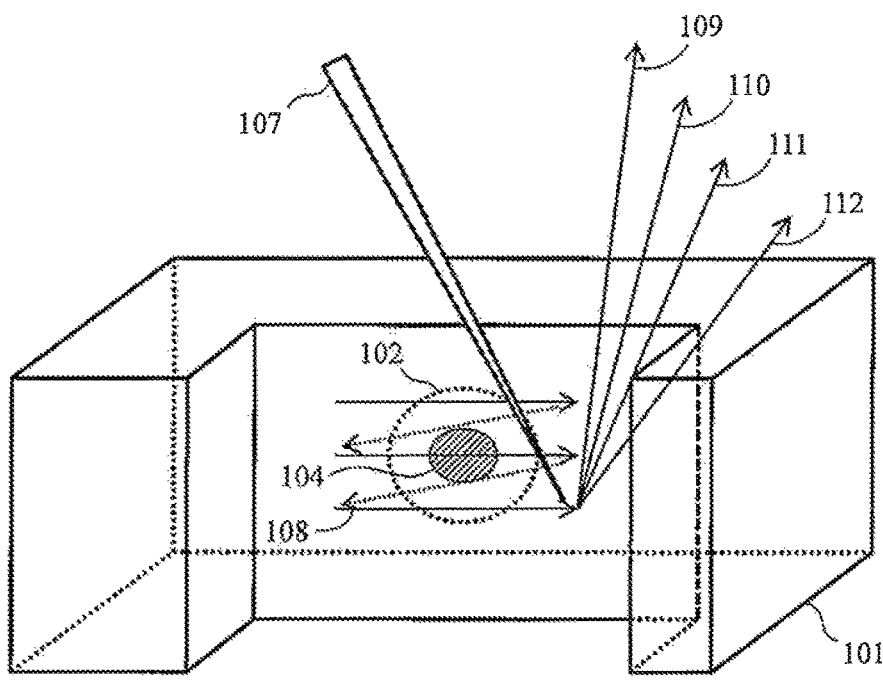

[FIG. 3E]
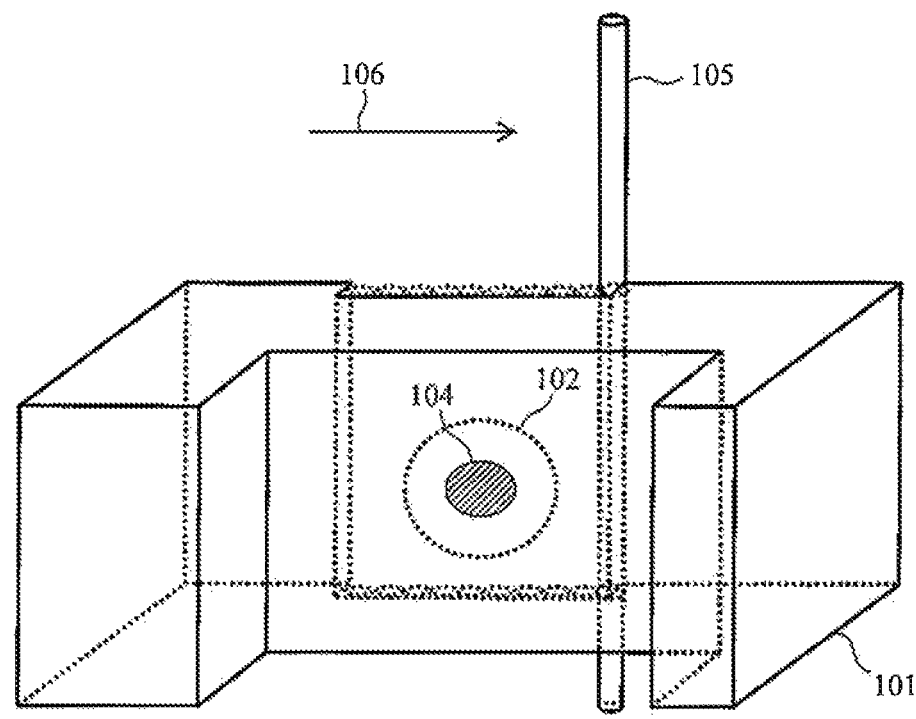
[FIG. 3F]
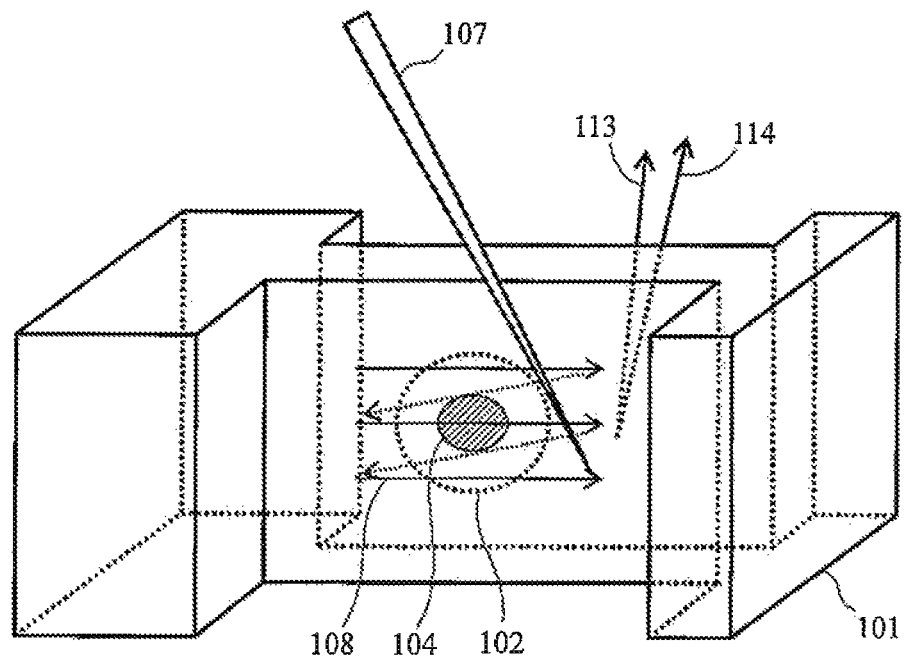

[FIG. 4A]
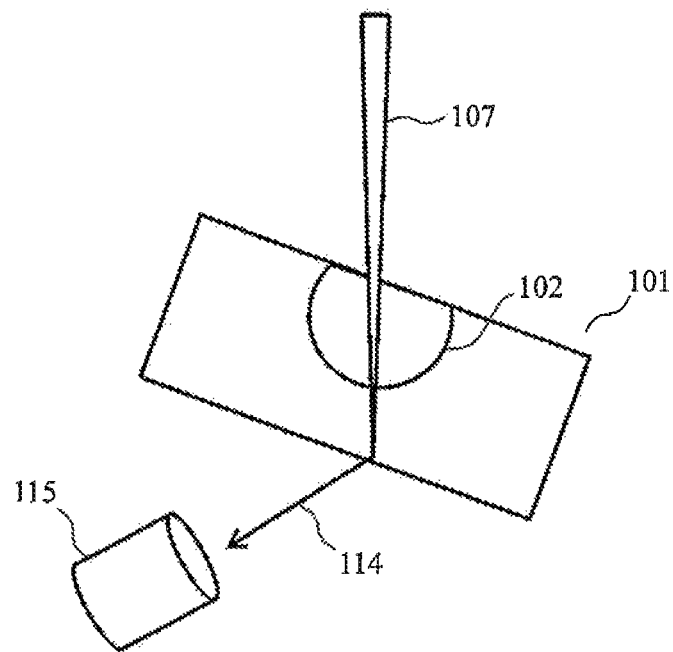
[FIG. 4B]
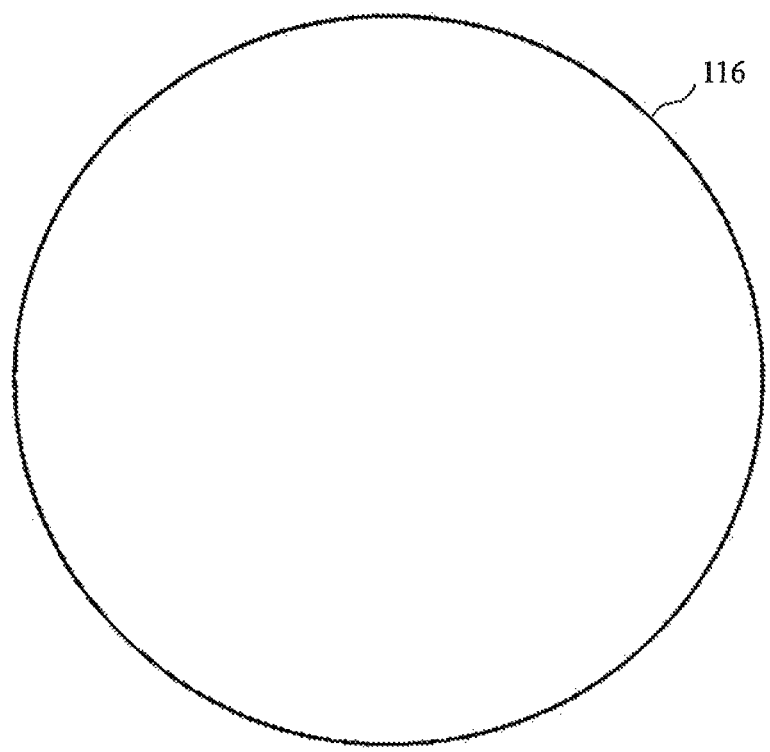

[FIG. 5A]
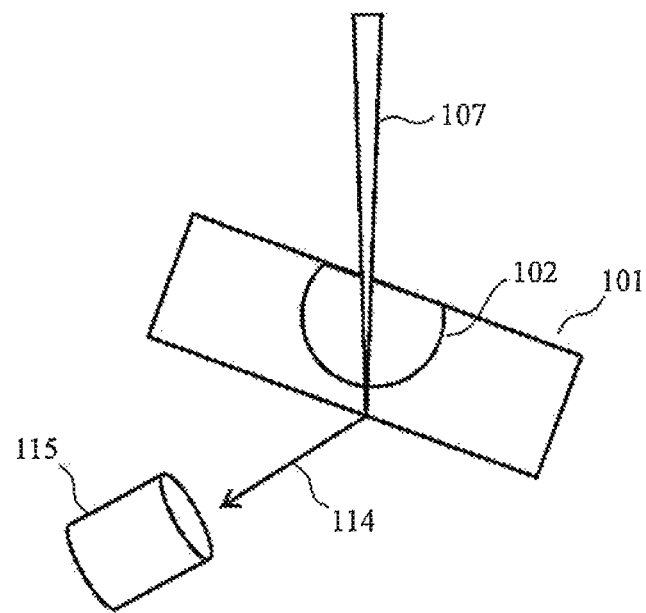
[FIG. 5B]
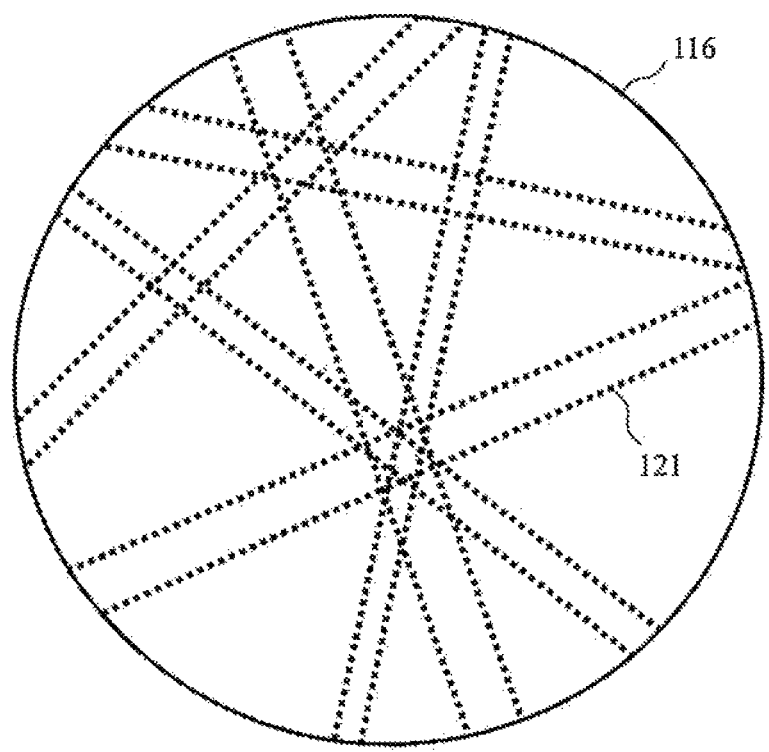

[FIG. 6A]
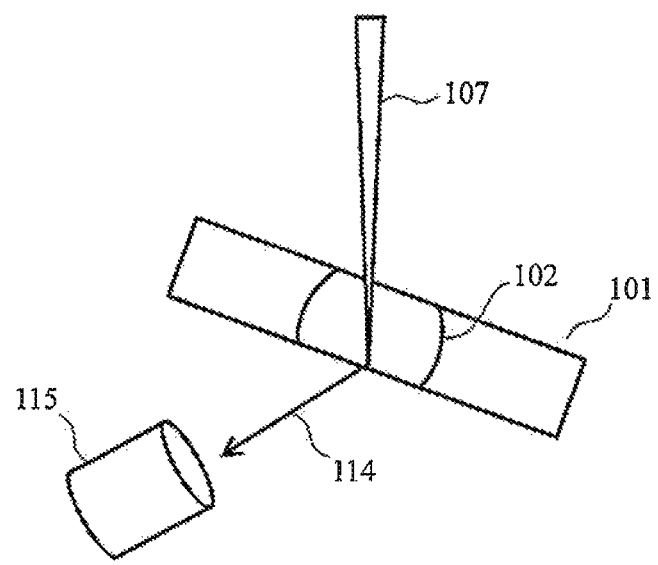
[FIG. 6B]
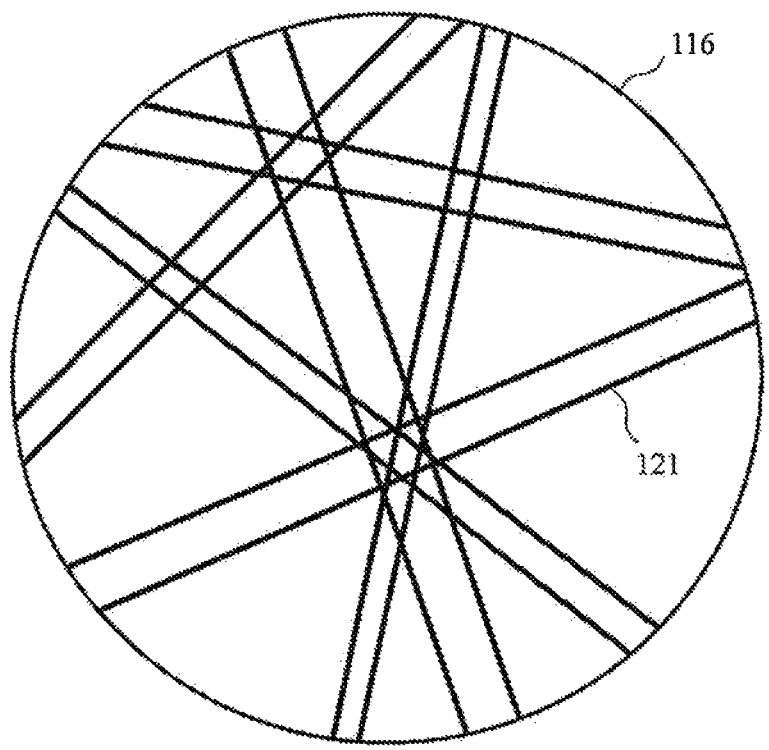

[FIG. 7A]
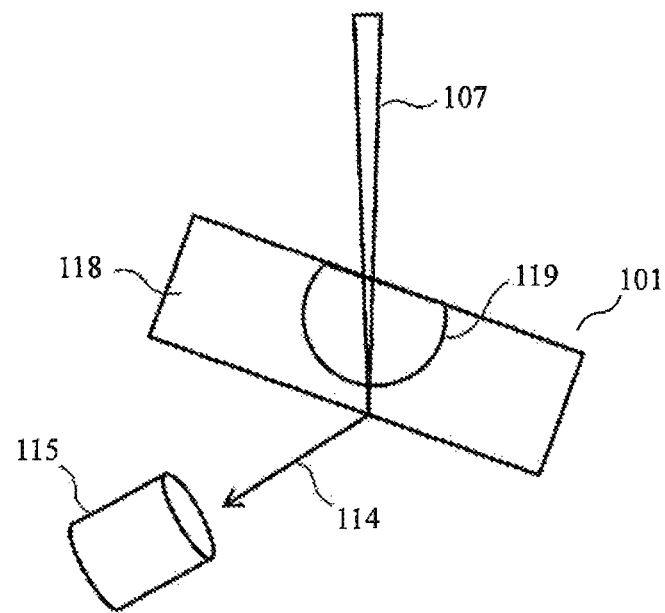
[FIG. 7B]
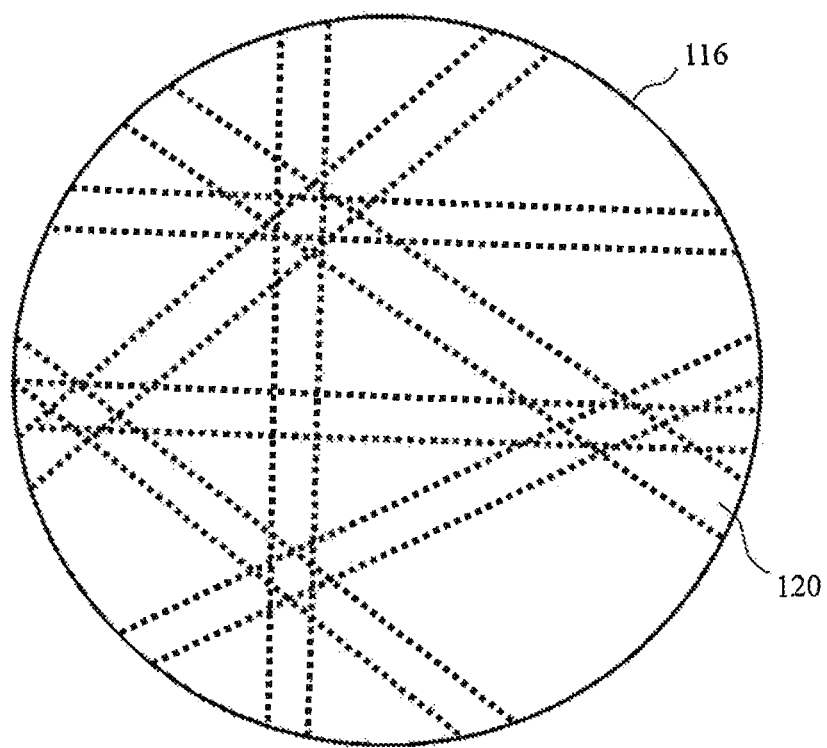

[FIG. 8B]
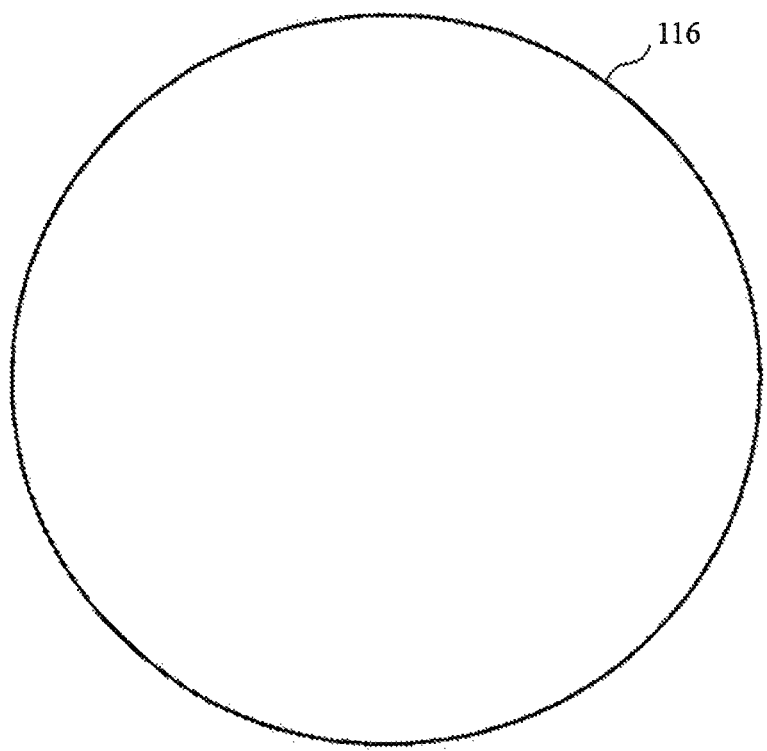

[FIG. 9A]
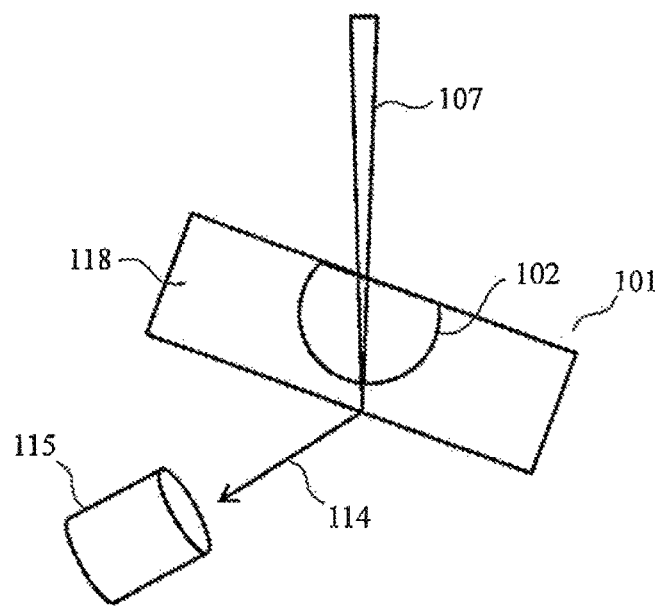
[FIG. 9B]
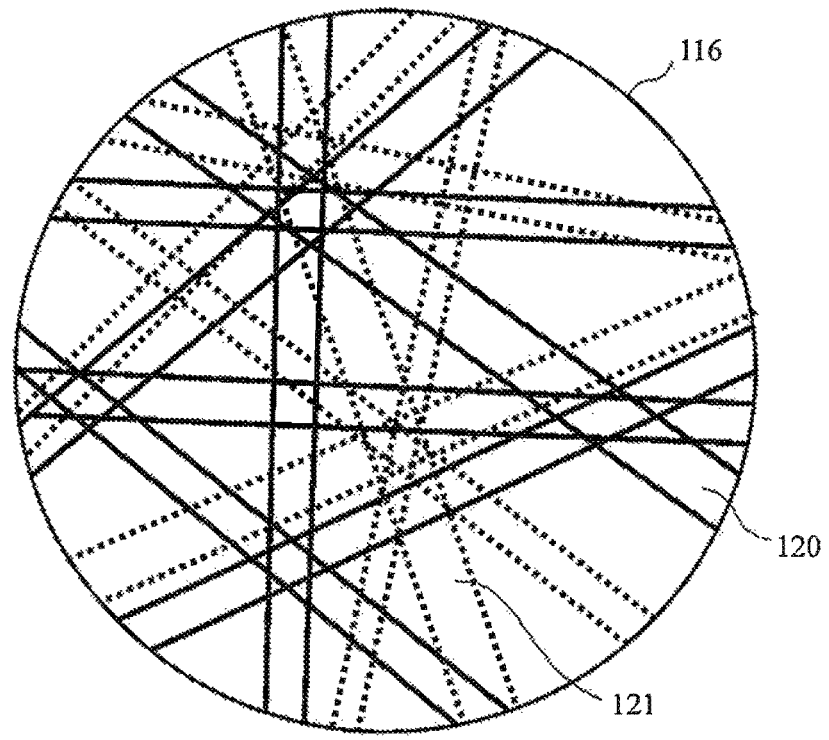

[FIG. 10A]
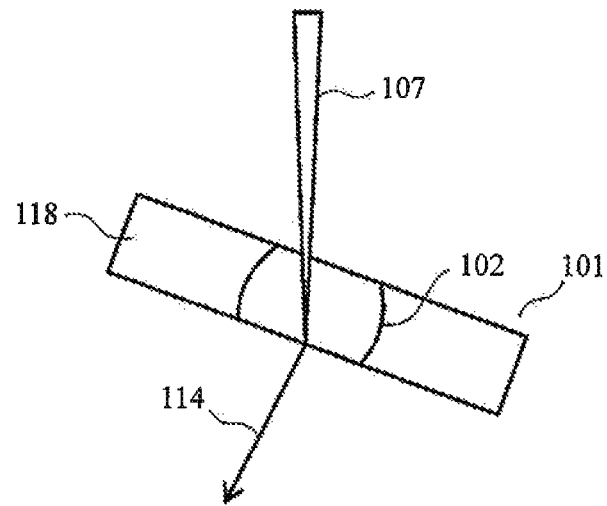
[FIG. 10B]
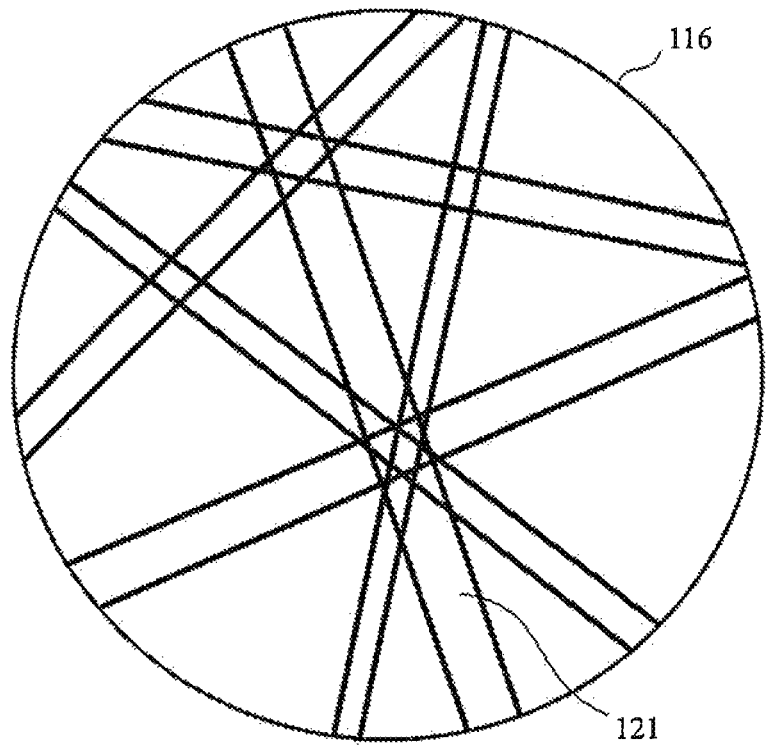

[FIG. 11]
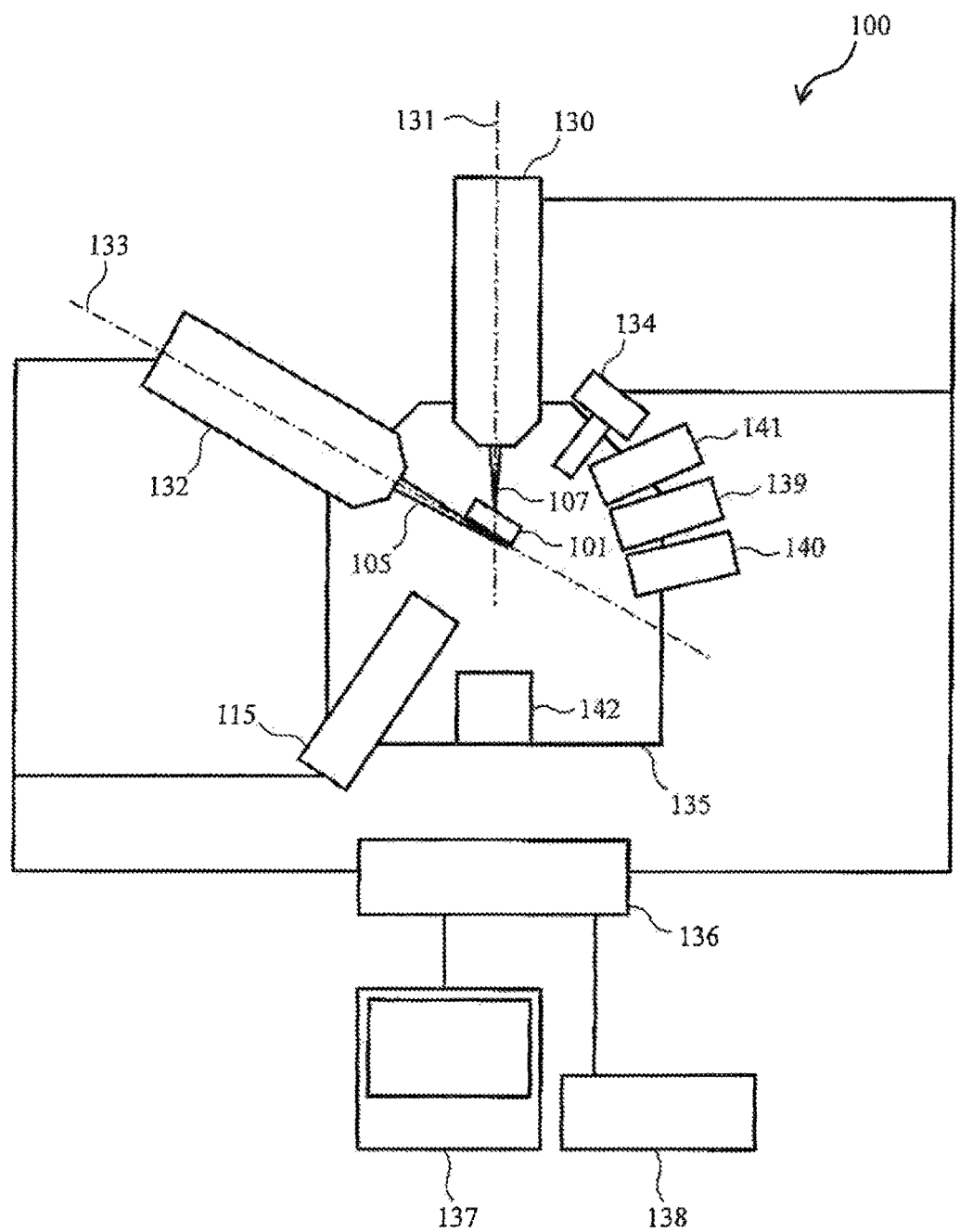

[FIG. 12]
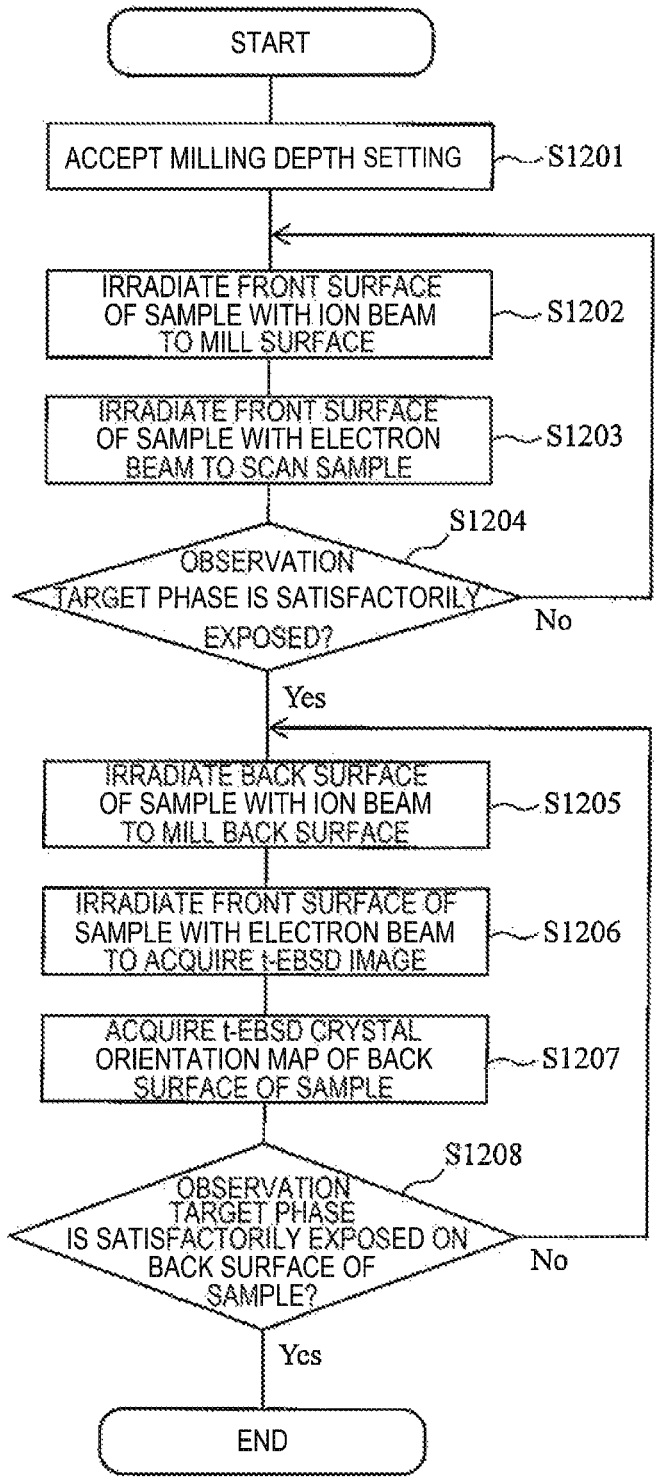

[FIG. 13A]
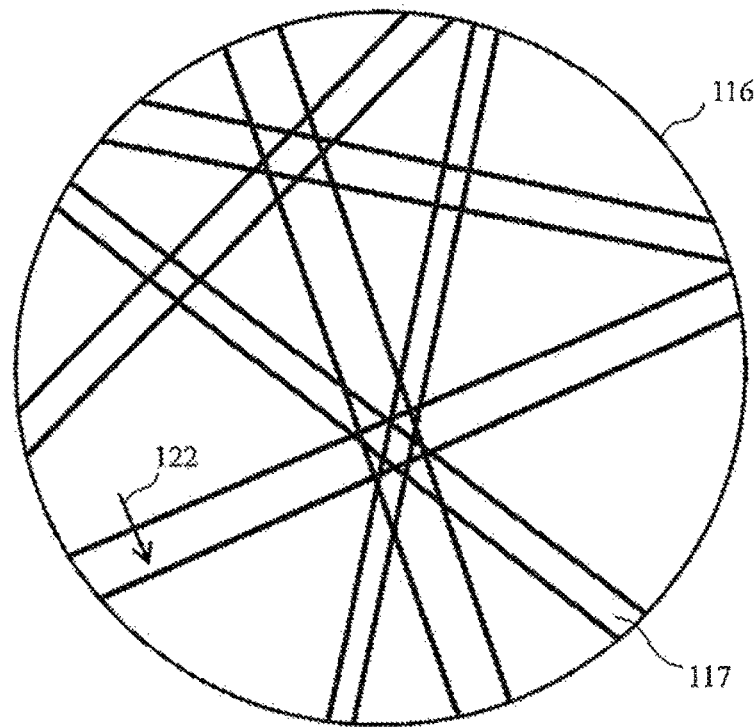
[FIG. 13B]
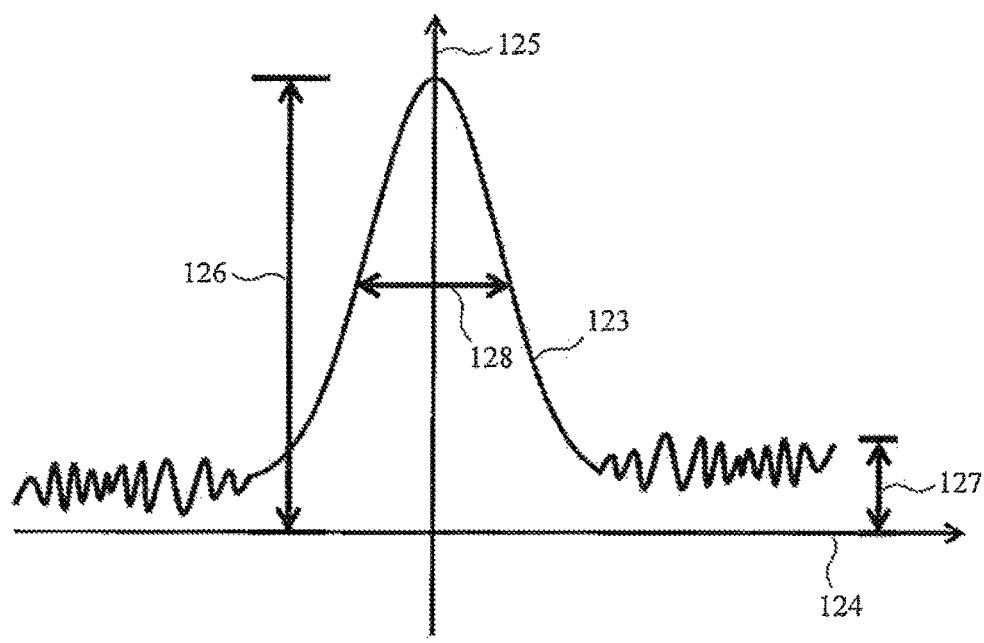

SAMPLE PROCESSING METHOD AND CHARGED PARTICLE BEAM DEVICE

TECHNICAL FIELD

The present invention relates to a sample processing method and a charged particle beam device and relates to, for example, a technique for performing sample processing with the use of a device in which a focused ion beam system is combined with a scanning electron microscope.

BACKGROUND ART

A focused ion beam system (FIB) is used for sample processing in a nano-range having several hundreds or less of nanometer in a sample. In particular, a sample for a transmission electron microscope (TEM) or a scanning transmission electron microscope (STEM) is required to be processed so that the sample has a thin film shape having a substantially uniform thickness of several hundreds nanometers or less and including a nanoscale observation target position inside the sample. As processing of such a thin film sample, the thin film sample is prepared by milling a front surface and a back surface of the sample with a focused ion beam. Whether or not the observation target position is included in the sample is determined by observing a state of the front surface of the sample with the use of a scanning ion microscope image (Scanning Ion Microscope: SIM image) obtained by detecting secondary ions or secondary electrons induced by a focused ion beam with which the front surface of the sample has been irradiated and imaging the secondary ions or secondary electrons. In the case of the sample including the nanoscale observation target position, resolution of the SIM image is insufficient to observe a state of the front surface of the sample in some cases. For processing of such a sample, a FIB-SEM combined device (FIB-SEM) in which a scanning electron microscope (SEM) is combined with a FIB is used, and, a method of observing a surface of the sample processed by the FIB with the use of a high-resolution SEM image is used.

For observation using the TEM or STEM, it is essential that a desired nanoscale observation target position be included in a prepared thin film sample. For that purpose, it is important to stop milling using the FIB on both a front surface side and a back surface side of the sample at appropriate end points. As a method of obtaining end points, for example, PTL 1 discloses a method of setting points of time at which a sample has a film thickness determined in advance as end points on a front surface side and a back surface side thereof by providing, in a FIB-SEM, a detector for detecting electrons that have been transmitted through the sample and calculating a film thickness of the sample with the use of a contrast of a transmission electron image based on signals detected by the detector for detecting the transmitted electrons.

NPL 1 discloses that a Kikuchi pattern (back-scattered electron diffraction image) of an electron diffraction wave emitted from a back surface of a sample, the electron diffraction wave being caused by electrons injected through a front surface of the sample, is obtained.

CITATION LIST

Patent Literature

PTL 1: JP-A-2012-507728

Non Patent Literature

NPL 1: Seiichi Suzuki, Evaluation of Transmission-EBSD Method and Its Application to Observation of Microstructures of Metals, J. Japan Inst. Met. Mater., 2013, pp. 268-275

SUMMARY OF INVENTION

Technical Problem

Regarding a sample including two or more phases inside the sample, at least one of which has a nanoscale shape, a TEM or STEM thin film sample including a nanoscale phase is prepared by milling both a front surface side and a back surface side of the sample with the use of a FIB-SEM. At this time, in the case where a phase other than a desired phase remains on one or both of a front surface side and a back surface side of the desired phase, it is needless to say that a contrast of an image obtained when the sample is observed with the TEM or STEM deteriorates, as compared with the case where no other phase remains. That is, in order to obtain a high-quality TEM or STEM image, it is important to prepare a thin film sample in which a phase other than a desired phase does not remain on the front surface side or the back surface side of the desired phase. It is possible to comparatively easily obtain an end point on the front surface side of the sample because a shape of the front surface can be directly obtained on the basis of a SEM image.

However, in the case where the method of PTL 1 is used, it is possible to determine that a desired phase exists inside a sample, but it is difficult to securely know whether or not the desired phase is exposed on a back surface side. In other words, even in the case where a technique of PTL 1 is used, it is impossible to easily know a milling endpoint on the back surface of the sample. Further, NPL 1 only discloses that an electron diffraction wave emitted from a back surface of a sample is detected and does not disclose that an end point of FIB milling on the back surface of the sample is obtained or does not even disclose milling itself. In other words, NPL 1 does not disclose a relationship between a Kikuchi pattern and a milling operation end point.

The invention has been made in view of such a circumstance and provides a technique for, in preparation of a TEM or STEM sample using a FIB-SEM, obtaining a processing end point on a back surface side of the sample.

Solution to Problem

In order to solve the above problems, in the invention, a processing state of a back surface of a sample using a FIB is detected by using a Kikuchi pattern formed when electrons injected by a SEM are emitted from the back surface of the sample. Electron diffraction of the electrons emitted from the back surface is referred to as "transmission backscattered electron diffraction (t-EBSD)". When an electron diffraction wave emitted by t-EBSD satisfies a Bragg's condition, there is generated a diffraction pattern referred to as "Kikuchi pattern" derived from a crystal structure, a crystal orientation relative to an injected electron beam, and a crystal lattice constant. In the invention, a processing end point on a back surface side is obtained by detecting the Kikuchi pattern generated by t-EBSD.

In other words, the invention is a sample processing method of processing a sample including at least two phases, at least one of the at least two phases including a structure serving as an observation target, the sample processing method including: a step of performing, by using an ion beam, ion milling on a phase on a back surface of the sample facing a front surface of the sample serving as an electron beam irradiation surface of the sample, the phase being different from the phase including the structure serving as the observation target; and a step of determining a processing end point on the back surface of the sample on the basis of a strength of an interference image of an electron diffraction wave generated from the back surface of the sample by, after performing ion milling on the back surface of the sample, irradiating the front surface of the sample with an electron beam and transmitting the electron beam through the sample.

Further features related to the invention will be disclosed by description of the present specification and attached drawings. Further, embodiments of the invention are achieved and realized by elements, various combinations of the elements, the following detailed description, and aspects in attached CLAIMS.

Advantageous Effects of Invention

According to the invention, in the case where a TEM or STEM sample is prepared by using a FIB-SEM, it is possible to know a processing endpoint on a back surface side of the sample.

BRIEF DESCRIPTION OF DRAWINGS

FIG. 1A is a bird's-eye view showing a schematic structure of a sample for use in an embodiment of the invention.

FIG. 1B is a top perspective view showing a schematic structure of the sample for use in the embodiment of the invention.

FIG. 1C is the whole perspective view showing a schematic structure of the sample for use in the embodiment of the invention.

FIG. 1D is a right-side perspective view showing a schematic structure of the sample for use in the embodiment of the invention.

FIG. 2 shows a schematic structure of a thin film sample according to an embodiment of the invention.

FIG. 3A shows Procedure 1 performed at the time of preparation of a thin film sample according to an embodiment of the invention.

FIG. 3B shows Procedure 2 performed at the time of preparation of the thin film sample according to the embodiment of the invention.

FIG. 3C shows Procedure 3 performed at the time of preparation of the thin film sample according to the embodiment of the invention.

FIG. 3D shows Procedure 4 performed at the time of preparation of the thin film sample according to the embodiment of the invention.

FIG. 3E shows Procedure 5 performed at the time of preparation of the thin film sample according to the embodiment of the invention.

FIG. 3F shows Procedure 6 performed at the time of preparation of the thin film sample according to the embodiment of the invention.

FIG. 4A shows a state in which a processing end point of preparation of a thin film sample according to an embodiment of the invention is not reached at all.

FIG. 4B shows a transmission back-scattered electron diffraction image obtained in a state in which the processing end point of preparation of the thin film sample is not reached at all.

FIG. 5A shows a state in which a processing end point of preparation of a thin film sample according to an embodiment of the invention is nearly reached.

FIG. 5B shows a transmission back-scattered electron diffraction image obtained in a state in which the processing end point of preparation of the thin film sample is nearly reached.

FIG. 6A shows a state in which a processing endpoint of preparation of a thin film sample according to an embodiment of the invention is reached.

FIG. 6B shows a transmission back-scattered electron diffraction image obtained in a state in which the processing end point of preparation of the thin film sample is reached.

FIG. 7A shows a state in which a processing endpoint is not reached in the case where a thin film sample is prepared from a sample in which a crystalline phase includes a non-crystalline phase.

FIG. 7B shows a transmission back-scattered electron diffraction image obtained in a state in which the processing endpoint is not reached in the case where the thin film sample is prepared from the sample in which a crystalline phase includes a non-crystalline phase.

FIG. 8A shows a state in which a processing endpoint is reached in the case where a thin film sample is prepared from a sample in which a crystalline phase includes a non-crystalline phase.

FIG. 8B shows a transmission back-scattered electron diffraction image obtained in a state in which the processing end point is reached in the case where the thin film sample is prepared from the sample in which a crystalline phase includes a non-crystalline phase.

FIG. 9A shows a state in which a processing endpoint is not reached in the case where a thin film sample is prepared from a sample in which a crystalline phase includes another crystalline phase.

FIG. 9B shows a transmission back-scattered electron diffraction image obtained in a state in which the processing endpoint is not reached in the case where the thin film sample is prepared from the sample in which a crystalline phase includes another crystalline phase.

FIG. 10A shows a state in which a processing end point is reached in the case where a thin film sample is prepared from a sample in which a crystalline phase includes another crystalline phase.

FIG. 10B shows a transmission back-scattered electron diffraction image obtained in a state in which the processing endpoint is reached in the case where the thin film sample is prepared from the sample in which a crystalline phase includes another crystalline phase.

FIG. 11 shows a schematic configuration of a charged particle beam device according to an embodiment of the invention.

FIG. 12 is a flowchart for describing a thin film sample preparation process using a charged particle beam device according to an embodiment of the invention.

FIG. 13A shows an evaluation example of a strength of a Kikuchi pattern according to a second embodiment of the invention.

FIG. 13B shows a profile example showing the strength of the Kikuchi pattern according to the second embodiment of the invention.

DESCRIPTION OF EMBODIMENTS

Hereinafter, embodiments of the invention will be described with reference to the attached drawings. In the attached drawings, functionally the same elements are denoted by the same numbers in some cases. Note that, although the attached drawings show specific embodiments and implementation examples based on a principle of the invention, the attached drawings are used to understand the invention and should never be used to limitedly interpret the invention.

Although sufficiently detailed description for a person skilled in the art to implement the invention is made in this embodiment, other implementations and modes are also possible, and it is necessary to understand that configurations/structures can be changed and various components can be replaced within the scope and spirit of the technical idea of the invention. Therefore, the following description should not be interpreted while being limited thereto.

(1) First Embodiment

<Sample Structure>

FIGS. 1A to 1D show an example of a structure of a solid sample for use in sample processing used in an embodiment of the invention. FIG. 1A is a bird's-eye view, FIG. 1B is a perspective view from a top surface of the sample, FIG. 1C is a perspective view from a front surface of the sample, and FIG. 1D is a perspective view from a right surface of the sample.

Although FIGS. 1A to 1D show a case where a sample 101 is a rectangular parallelepiped, the sample does not need to be a strict rectangular parallelepiped, and facing sides may have different lengths or each angle maybe an angle other than a right angle. Further, the sample does not need to have a flat surface and may have a curved or uneven surface. The sample only needs to be a substantially rectangular parallelepiped. The sample is composed of at least two or more phases, and a nanoscale structure 102 having at least one phase exists inside the sample. Herein, in order to simplify the description, there will be described a case where a sample composed of one phase includes a different phase and the included phase is a single particle form. The number of particles is not limited to one, and a plurality of particles maybe included therein. A shape of the phase of the nanoscale structure 102 is not limited to a particle shape and may be a tubular, layered, or complicated three-dimensional shape. Furthermore, FIGS. 1A to 1D show a case where the particle phase inside the sample is not exposed to a surface of the sample, but a part or a plurality of parts of the particle phase may be exposed to any one or a plurality of surfaces of the sample. At least one of the phases existing in the sample is a monocrystalline or polycrystalline phase, and another phase is a monocrystalline, polycrystalline, or non-crystalline phase. A target to be subjected to TEM or STEM observation after sample processing is the particle phase existing therein, and a direction in which an electron beam is transmitted by a TEM or STEM is a direction of an arrow 103. Therefore, a shape of the processed sample is obtained by performing processing so that at least apart of the sample has a thin-film shape as shown in FIG. 2. Although FIG. 2 shows a sample in which unprocessed regions remain at both ends of a thin film, one side or both sides of the unprocessed regions may not remain.

<Outline of Thin Film Sample Preparation Procedures>

FIGS. 3A to 3F show procedures of a method of processing the sample shown in FIGS. 1 so that the sample has the form shown in FIG. 2. Hereinafter, a sample surface irradiated with an ion beam 105 or electron beam 107 is referred to as "front surface", and a surface facing the front surface is referred to as "back surface".

Procedure 1 (FIG. 3A): The focused ion beam 105 is emitted toward a surface side of a top surface of a sample. Although emitted ion species are typically $Ga^+$, $Ar^{30}$, $O^+$, $He^+$, and the like, the ion species are not limited to monovalent ions and may be polyvalent ions, are not limited to cations but may be anions, and may be elements or ions of compounds that are not described herein. A substance on the front surface of the sample is sputtered by the ion beam 105, and the substance on the front surface of the sample serving as an ion beam irradiation portion is removed.

Procedure 2 (FIG. 3B): When scanning is gradually performed with the ion beam 105 along the front surface of the sample, a range in which the substance has been removed is increased. In FIG. 3B, scanning is performed by moving the ion beam 105 stepwise from left to right (ion beam is moved to ion irradiation position→ion irradiation-→irradiation stop→ion beams is moved to the next irradiation position→ion irradiation . . . ), but the ion beam may be moved from right to left. Further, scanning with the ion beam 105 may not be stepwise scanning but may be continuous scanning (scanning position is moved while ion irradiation is being performed). Furthermore, scanning with the ion beam 105 does not need to be performed in a single direction, and the ion beam 105 may be moved at intervals determined in advance, or the ion beam 105 may be moved at random intervals. It is only necessary to irradiate, with the ion beam 105, the whole region of a width at which a thin film sample is to be prepared. Further, the same region may be scanned a plurality of times.

Procedure 3 (FIG. 3C): After scanning with the ion beam 105 along the front surface of the sample is completed, an irradiation region with the ion beam 105 is shifted from the front surface of the sample to a depth side thereof, and ion beam scanning of Procedure 2 (FIG. 3B) is implemented. Then, Procedure 3 is repeated a plurality of times, and therefore the sample surface is moved from a front side to the depth side and a thickness of the sample is reduced. Note that how deep the sample is scraped can be roughly determined as follows. Specifically, a SEM irradiates an unprocessed sample (bulk sample) with an electron beam to detect a depth at which the electron beam enters. An acceleration voltage of the electron beam is gradually increased, and at which depth an electron beam image of a structure different from that of a surface of the bulk sample can be seen is checked. By using the fact that an entering depth of the electron beam can be controlled by controlling the acceleration voltage of the electron beam as described above, it is possible to roughly know a processing depth of the sample. Then, a depth of ion milling is set to be the rough processing depth that has been known by irradiation with the electron beam, and the processing can be started. Further, it is possible to predict the depth also by using Monte Carlo simulation. Furthermore, the processing depth for one ion irradiation may be set in advance and the processing may be performed by repeating Procedures 3 and 4. Still further, a depth to an observation target phase may be obtained by performing ultrasonic inspection on the unprocessed sample.

Procedure 4 (FIG. 3D): After Procedure 3 is executed once or Procedure 3 is executed a plurality of times, ion beam irradiation is stopped, and the electron beam 107 is emitted obliquely from above toward the front surface of the sample to scan the front surface of the sample. Secondary electrons 109, back-scattered electrons 110, a characteristic X-ray 111, and an electron diffraction wave 112 are emitted from the front surface of the sample. When those signals are mapped to correspond to scanning coordinates, a secondary electron image, a back-scattered electron image, an element map, and a crystal orientation map of the front surface of the sample are obtained. By using at least one map of the secondary electron image, the back-scattered electron image, the element map, and the crystal orientation map, it is possible to check whether or not a phase serving as an observation target is exposed to the front surface of the sample. In the case where the phase serving as an observation target is exposed, the process proceeds to Procedure 5 (FIG. 3E). In the case where the phase is not exposed, the process returns to Procedure 3 (FIG. 3C), and the processing (milling by ion irradiation) is further performed, and then Procedure 4 (FIG. 3D) is implemented again to check whether or not the phase serving as an observation target is exposed. This loop is repeated until the phase serving as an observation target is exposed.

Procedure 5 (FIG. 3E): The irradiation position of the ion beam 105 is moved to a back surface side of the top surface of the sample (or a sample stage is moved so that ion irradiation can be performed on the back surface of the sample), and the back surface is irradiated with the focused ion beam 105. Processes similar to Procedure 3 (FIG. 3C) and Procedure 4 (FIG. 3D) are performed on the back surface to remove a substance on the back surface side, and therefore the sample is formed into a thin film.

Procedure 6 (FIG. 3F): Ion beam irradiation is stopped, and the electron beam 107 is emitted obliquely from above toward the front surface of the sample to scan the front surface of the sample. At this time, it is desirable that a direction in which the electron beam 107 is injected be a direction inclined at 20 to 60° with respect to an irradiation axis of the ion beam 105, and it is more desirable that an angle of inclination be 40°. At this time, transmission electrons 113 and an electron diffraction wave 114 caused by t-EBSD are emitted from the back surface of the sample. When those signals are mapped to correspond to scanning coordinates, a transmission electron image of the sample and a t-EBSD crystal orientation map of the back surface of the sample are obtained. Note that, although the transmission electron image can be used to check whether or not the phase serving as an observation target is included in the thin-film-like sample, it is impossible to know whether or not the phase serving as an observation target is exposed to the back surface of the sample. Meanwhile, when the t-EBSD crystal orientation map of the back surface of the sample (transmission back-scattered electron diffraction image (Kikuchi pattern) group corresponding to electron beam irradiation positions) is used, it is possible to presume a crystal structure of the back surface of the sample, and it is possible to presume a substance exposed to the back surface. When exposure of a desired observation target phase to the back surface of the sample can be checked, the processing is terminated.

Hereinabove, an example where the processing of the back surface of the sample is performed after the processing of the front surface thereof is terminated has been described. However, the processing of the front surface and the back surface by using the ion beam 105 and observation thereof by using the electron beam 107 and the processing of the front surface and the back surface by using the ion beam 105 and observation thereof by using the electron beam 107 may be alternately repeated.

<Detection of Processing End Point>

A method of detecting a processing end point on the back surface according to the embodiment of the invention will be described with reference to FIGS. 4A to 6B. FIGS. 4A and 4B show a state in which no pattern is detected in the case where processing of the front surface of the sample is terminated and the phase serving as an observation target is exposed on the front surface side but another thick phase remains on the back surface. FIGS. 5A and 5B show a Kikuchi pattern detected in the case where the processing of the back surface is further performed and a film thickness of the other phase on the back surface side is reduced. FIGS. 6A and 6B show a substantially cross-sectional view of the sample obtained in the case where the processing of the back surface is further performed and the other phase is removed and a Kikuchi pattern corresponding thereto. Herein, as an example, the observation target phase is a polycrystalline or monocrystalline phase and the other phase is a non-crystalline (glass, rubber, plastic, or the like) phase. Note that, as an example, the sample shown in FIGS. 4A to 6B is a sample in which a non-crystalline phase includes a crystalline phase.

In the case of FIG. 4A, the electron diffraction wave 114 emitted from the back surface of the sample is emitted from the non-crystalline phase. Therefore, the Bragg's condition is not satisfied, and a Kikuchi pattern 116 is not observed. In the case of FIG. 5A, when the thickness of the other phase on the back surface is less than approximately 30 nm, electron diffraction waves 114 are emitted from the crystalline phase serving as the observation target phase and the other non-crystalline phase. Of those electron diffraction waves, the electron diffraction wave 114 emitted from the crystalline phase serving as the observation target phase satisfies the Bragg's condition, and therefore the Kikuchi pattern 116 is observed. However, a strength of the Kikuchi pattern 116 is low. The strength of the Kikuchi pattern 116 is increased as the processing of the back surface proceeds, and, when the observation target phase on the back surface is exposed as shown in FIG. 6A, the clear Kikuchi pattern 116 is observed. When the Kikuchi pattern 116 is obtained, it is possible to estimate a crystal structure, a crystal lattice constant, and a crystal orientation, and it is possible to confirm exposure of a nanoscale layer of interest. When the observation target phase is exposed on the back surface, the strength of the Kikuchi pattern 116 is saturated. Therefore, the processing is stopped by using a point of time at which saturation is confirmed (visually confirmed) as the processing end point on the back surface. Note that whether or not the strength of the pattern is saturated may be determined by comparing a peak value of the pattern strength that has been previously measured with a peak value of the pattern strength measured this time, and it may be determined that the strength is saturated in the case where a strength difference is equal to or less than a predetermined threshold.

FIG. 7A to FIG. 8B show a case where the included observation target phase is a non-crystalline phase and another phase outside the observation target phase is a monocrystalline or polycrystalline phase. Because the back surface of the sample is a crystal, the electron diffraction wave 114 emitted from the back surface of the sample can satisfy the Bragg's condition. Therefore, the Kikuchi pattern 116 is observable. However, a strength of the electron diffraction wave 114 injected on the back surface of the sample is reduced due to scattering occurring when the electron diffraction wave is transmitted through a non-crystalline portion. Therefore, the strength thereof is lower than that of the electron diffraction wave emitted from a crystal portion (see FIG. 7B). As shown in FIG. 8A, when the processing of the back surface proceeds and a crystalline phase on the back surface is completely removed, the Kikuchi pattern 116 disappears (see FIG. 8B), and therefore it is possible to stop the processing by using a point of time at which the Kikuchi pattern has disappeared as the processing end point on the back surface.

FIGS. 9A to 10B show a case where both the included observation target phase and another phase are monocrystalline or polycrystalline phases. In the case where the thickness of the other phase on the back surface is larger than approximately 30 nm, only a Kikuchi pattern 120 derived from a crystal structure of the other phase is observed. When the thickness becomes less than approximately 30 nm, an overlap of the Kikuchi pattern 120 derived from the crystal structure of the other phase and a Kikuchi pattern 121 derived from a crystal structure of the observation target phase is observed (see FIG. 9B). When the processing proceeds and the other phase on the back surface is removed, the Kikuchi pattern 120 derived from the crystal structure of the other phase disappears and only the Kikuchi pattern 121 derived from the crystal structure of the observation target phase is observed (see FIG. 10B). The processing is stopped by using a point of time at which the Kikuchi pattern 120 derived from the crystal structure of the other phase has disappeared as the processing end point on the back surface.

Note that, regarding how much pattern strength is necessary to determine the processing end point, for example, various substances and Kikuchi pattern strengths corresponding thereto are registered in advance in a database. In the case where a substance of the observation target phase is known, it is possible to determine whether or not a point is the processing end point by comparing an observed Kikuchi pattern strength of the substance with the Kikuchi pattern strength of the substance registered in the database.

<Configuration of Charged Particle Beam Device>

FIG. 11 shows a schematic configuration of a charged particle beam device according to the embodiment of the invention. The charged particle beam device (FIB-SEM) 100 includes a SEM housing 130 including an electron source, an electron acceleration unit, an electron focusing lens, and an electron beam scanning mechanism and a FIB housing 132 including an ion source, an ion acceleration unit, an ion focusing lens, and an ion beam scanning mechanism. An electron beam axis 131 and an ion beam axis 133 thereof are placed to intersect with each other in the vicinity of the sample 101. Although this embodiment shows an example where the electron beam axis 131 of the SEM housing 130 is placed in a vertical direction and the ion beam axis 133 of the FIB housing 132 is obliquely placed, placement directions are arbitrary directions, and the ion beam axis 133 may be vertically placed and the electron beam axis 131 maybe obliquely placed, or both the electron beam axis 131 and the ion beam axis 133 may be obliquely placed. An angle of intersection between the electron beam axis 131 and the ion beam axis 133 is desirably 20 to 60°, and more desirably 40°.

The electron beam 107 emitted from the SEM housing 130 can be used to perform scanning in two directions vertical to the electron beam axis 131 shown in FIG. 11 by using the electron beam scanning mechanism. The ion beam 105 emitted from the FIB housing 132 can be used to perform scanning in two directions vertical to the ion beam axis 133 shown in FIG. 11 by using the ion beam scanning mechanism. The sample 101 is placed on a sample stage (now shown), and the sample stage can be moved in parallel in three orthogonal directions and can be rotationally moved around two axes.

An observation position and a processing position of the sample 101 can be roughly adjusted by moving or rotating the sample stage. Meanwhile, nanoscale minute position movement is realized by shifting a scanning position of the ion beam 105 or a scanning position of the electron beam 107 with the use of the corresponding scanning mechanism. The sample 101 is placed on the ion beam axis 133 so that a surface to be processed is in parallel to the ion beam axis 133 and is vertical to an ion beam scanning direction. Further, the sample 101 is placed on the electron beam axis 131.

A secondary electron detector 134 may be provided above the sample 101. In the case where the electron beam 107 is emitted from the SEM housing 130 toward the sample 101, the secondary electron detector 134 can detect the secondary electrons 109 induced by the electron beam 107, and, in the case where the ion beam 105 is emitted from the FIB housing 132 toward the sample 101, the secondary electron detector 134 can detect the secondary electrons 109 induced by the ion beam 105. The detector is not limited thereto, and a detector for detecting secondary ions induced by the ion beam 105 may be separately provided. Further, as necessary, one or more of an EDX detector 140 for detecting the characteristic X-ray 111 emitted from the front surface of the sample, an EBSD detector 139 for detecting an interference pattern generated by the electron diffraction wave 112 emitted from the front surface of the sample, and a BSE detector 141 for detecting the back-scattered electrons 110 emitted from the front surface of the sample may be provided. Furthermore, a t-EBSD detector 115 for detecting the transmission back-scattered electron diffraction wave 112 and a transmission electron detector 142 for detecting electrons that have been transmitted through the sample 101 are placed below the sample 101.

<Operation of Charged Particle Beam Device at the Time of Sample Processing>

FIG. 12 is a flowchart for describing thin film sample preparation steps using the charged particle beam device according to the embodiment of the invention.

(i) Step 1201: A computer 136 accepts setting of a depth of ion milling (depth from front surface and depth from back surface) of a sample, which is input by an operator. The depth of ion milling may be a value based on experiences of the operator or may be a specified value determined in advance (setting value of depth scraped for one ion milling). Further, as described above, the depth of ion milling maybe determined by irradiating a bulk sample with an electron beam while gradually increasing an acceleration voltage, checking an image obtained from an entering position of the electron beam, and roughly specifying a position of the observation target phase.

(ii) Step 1202: The computer 136 controls the ion source, the ion acceleration unit, the ion focusing lens, and the ion beam scanning mechanism included in the FIB housing 132 so that the front surface of the sample is irradiated with an ion beam and the sample is scraped from the front surface by the depth set in Step 1201.

(iii) Step 1203: The computer 136 controls the electron source, the electron acceleration unit, the electron focusing lens, and the electron beam scanning mechanism included in the SEM housing 130 so that the milled sample surface is irradiated/scanned with an electron beam. Then, the computer 136 generates an image (map) of each part on the front surface of the sample by using at least one of a secondary electron image, a back-scattered electron image, an element map, a crystal orientation map, a reflection electron image, and the like based on the secondary electrons 109, the back-scattered electrons 110, the characteristic X-ray 111, the electron diffraction wave 112, and reflection electrons, and the like emitted from the sample surface by electron beam irradiation.

(iv) Step 1204: The computer 136 determines whether or not the observation target phase is satisfactorily exposed on the front surface side of the sample. For example, in the case where the operator visually determines that the observation target phase is satisfactorily exposed, ion milling of the front surface of the sample may be terminated in such a way that the operator inputs an instruction indicating that ion milling of the front surface of the sample has been completed and the computer 136 accepts the instruction. Alternatively, in the case where the sample is known, termination of ion milling of the front surface of the sample may be determined in such a way that the computer 136 compares strengths of various images obtained from the front surface of the sample with strengths of various images obtained from the substance registered in advance in the database and determines whether or not a strength difference falls within a range of predetermined thresholds. In the case where it is determined that the observation target phase is satisfactorily exposed (Yes in Step 1204), the process proceeds to Step 1205. In the case where it is determined that the observation target phase is unsatisfactorily exposed (No in Step 1204), the process returns to Step 1202, and the ion milling process on the front surface of the sample is continued.

(v) Step 1205: The computer 136 controls the ion source, the ion acceleration unit, the ion focusing lens, and the ion beam scanning mechanism included in the FIB housing 132 so that the irradiation position of the ion beam 105 is moved to the back surface of the sample, the back surface of the sample is irradiated with an ion beam, and the sample is scraped from the back surface by the depth set in Step 1201.

(vi) Step 1206: The computer 136 controls the electron source, the electron acceleration unit, the electron focusing lens, and the electron beam scanning mechanism included in the SEM housing 130 so that the front surface of the sample is irradiated/scanned with an electron beam. Then, the computer 136 acquires a transmission back-scattered electron diffraction image (also referred to as "Kikuchi pattern" or "electron diffraction wave interference image") on the basis of the electron diffraction wave 114 caused by transmission back-scattered electron diffraction (t-EBSD) from the back surface of the sample.

(vii) Step 1207: The computer 136 generates a t-EBSD crystal orientation map (Kikuchi pattern group) on the basis of a Kikuchi pattern obtained from each part on the back surface of the sample.

(viii) Step 1208: The computer 136 determines whether or not the observation target phase is satisfactorily exposed on the back surface side of the sample. For example, in the case where the operator visually determines that the observation target phase is satisfactorily exposed, ion milling of the front surface of the sample may be terminated in such away that the operator inputs an instruction indicating that ion milling of the front surface of the sample has been completed and the computer 136 accepts the instruction. Alternatively, in the case where the sample is known, termination of ion milling of the back surface of the sample may be determined in such a way that the computer 136 compares a strength of a Kikuchi pattern obtained from the back surface of the sample with a strength of a Kikuchi pattern obtained from the substance registered in advance in the database and determines whether or not a strength difference falls within a range of predetermined thresholds. In the case where it is determined that the observation target phase is satisfactorily exposed (Yes in Step 1208), the sample processing is terminated. In the case where it is determined that the observation target phase is unsatisfactorily exposed (No in Step 1208), the process returns to Step 1205, and the ion milling process on the back surface of the sample is continued.

(2) Second Embodiment

In the processing method according to the first embodiment, the processing endpoint is determined on the basis of a change in strength of the Kikuchi pattern 116. However, determination is difficult in some cases, for example, in the case where noise of a background is large. In view of this, a second embodiment discloses a method of determining the processing end point on the basis of another parameter.

FIG. 13A shows an example of the Kikuchi pattern 116 acquired by t-EBSD. FIG. 13B shows a line profile obtained by plotting a strength profile of the Kikuchi pattern 116 along a line 122. That is, noise of the background and signals of a Kikuchi line 117 are overlapped.

Parameters representing the signals of the Kikuchi line 117 are typically a peak height 126, a signal/noise ratio, a half-value width 128, and the like. Among them, the peak height 126 is the same as the strength shown in the first embodiment. For example, in the case where the observation target phase is exposed on the front surface and the back surface as shown in FIG. 6A, the peak height 126 is large, the signal/noise ratio is large, and the half-value width 128 is small. Meanwhile, in the case where the other phase remains on the back surface as shown in FIG. 5A, the peak height 126 is small, the signal/noise ratio is small, and the half-value width 128 is large. Dependence of the peak height 126, the signal/noise ratio, and the half-value width 128 on a residual film thickness is changed depending on a material of the sample, and it is possible to know the processing end point on the back surface by observing at least two or more parameters of the peak height 126, the signal/noise ratio, and the half-value width 128 and determining whether or not the parameters fall within the respective ranges of predetermined thresholds.

(3) Third Embodiment

It is useful to obtain Kikuchi patterns 116 caused by t-EBSD in a plurality of different thicknesses by performing thin film processing on a sample having a structure similar to that of a sample serving as an observation target with a method similar to the method in the first embodiment. In other words, a database of the Kikuchi patterns 116 is prepared by using known samples, and a processing end point is detected by comparing the Kikuchi patterns with a Kikuchi pattern that is actually observed.

The Kikuchi patterns 116 having a plurality of thicknesses may be obtained by calculation (Monte Carlo simulation: method of calculating entering depth of electron beam as described above) without actually processing the sample. Specifically, in the Monte Carlo simulation, it is possible to set elements and a thickness of a substance, and therefore it is possible to know an attenuation strength of an electron beam in each setting. The strength of the electron beam and a strength of the Kikuchi pattern correlate with each other, and therefore it is possible to calculate a schematic strength of the Kikuchi pattern in each setting. Thus, a database of the strengths of the Kikuchi patterns corresponding to various elements and film thicknesses can be obtained by calculation. On the premise that such a database exists, a sample serving as an observation target is processed with the method according to the first embodiment and a Kikuchi pattern 116 is observed. Then, the Kikuchi pattern 116 acquired from the sample serving as an observation target is compared with the Kikuchi pattern 116 obtained in advance, and the processing is stopped by using a point of time at which the Kikuchi pattern 116 is matched with the Kikuchi pattern 116 of the processing end point obtained in advance as the processing end point on the back surface. Even in the case where the patterns are not completely matched, it is also possible to compare images by computer processing and set a point of time at which the images have similarity set in advance as the processing end point on the back surface.

(4) Conclusion of Embodiments

An electron diffraction wave caused by t-EBSD is only emitted from an extremely thin region having a depth equal to or less than about 30 nm on aback surface of a sample. Further, it is possible to know a crystal structure in the vicinity of the back surface of the sample by using a Kikuchi pattern, and it is possible to presume a material in the vicinity of the back surface of the sample. Therefore, by monitoring the electron diffraction wave caused by t-EBSD in the middle of FIB processing, it is possible to successively know a change in material of the back surface of the sample that is currently processed. Further, it is possible to detect a processing end point by detecting appearance or disappearance of a desired Kikuchi pattern. When an electron beam is injected by the SEM, secondary electrons and back-scattered electrons are emitted from a front surface of the sample, and, at the same time, an electron diffraction wave caused by t-EBSD is emitted from the back surface of the sample. By using signals emitted from the front surface of the sample and the methods according to the above embodiments, it is possible to simultaneously detect a processing state of the front surface of the sample and the back surface of the sample for one SEM observation, and therefore it is possible to easily detect processing endpoints on the front surface of the sample and the back surface of the sample.

The invention can be realized also by a program code of software for realizing functions of the embodiments. In this case, a storage medium in which the program code is recorded is provided to a system or a device, and a computer (or CPU or MPU) of the system or the device reads out the program code stored in the storage medium. In this case, the program code itself read out from the storage medium realizes the above functions of the embodiments, and the program code itself and the storage medium storing the program code constitute the invention. Examples of a storage medium for supplying such a program code encompass a flexible disk, a CD-ROM, a DVD-ROM, a hard disk, an optical disc, a magneto-optical disk, a CD-R, a magnetic tape, a nonvolatile memory card, and a ROM.

Further, an OS (operating system) or the like operating in a computer on the basis of an instruction of the program code may perform a part of or the whole actual processing, and the functions of the above embodiments may be realized by the processing. Furthermore, after the program code readout from the storage medium is written in a memory of the computer, a CPU or the like of the computer may perform a part of or the whole actual processing on the basis of an instruction of the program code, and the functions of the above embodiments may be realized by the processing.

Furthermore, the program code of the software for realizing the functions of the embodiments may be distributed via a network and be stored in storage means such as a hard disk or a memory of the system or device or a storage medium such as a CD-RW or a CD-R, and the computer (or CPU or MPU) of the system or device may read out the program code stored in the storage means or the storage medium at the time of usage thereof to thereby execute the program code.

Note that constituent elements in different embodiments may appropriately combined with one another. Although the invention has been specifically described by using the embodiments, those embodiments are not used for limitation but are used for description in all aspects. A person skilled in this field understands that there are a number of combinations of hardware, software, and firmware suitable for implementing the invention. For example, the software described herein may be implemented by a wide range of programs or script languages such as assembler, C/C++, perl, Shell, PHP, and Java (registered trademark).

Furthermore, control lines and information lines which are considered to be necessary for description are shown in the above embodiments, and not all control lines and information lines in a product are necessarily shown. All the configurations may be connected to one another.

REFERENCE SIGNS LIST

101 . . . sample
102 . . . included particle-like observation target phase
103 . . . direction in which electron is transmitted by TEM or STEM
104 . . . exposed portion of included particle-like observation target phase
105 . . . ion beam
106 . . . scanning direction of ion beam
107 . . . electron beam
108 . . . scanning direction of electron beam
109 . . . secondary electron
110 . . . back-scattered electron
111 . . . characteristic X-ray
112 . . . electron diffraction wave
113 . . . transmission electron
114 . . . electron diffraction wave caused by t-EBSD
115 . . . t-EBSD detector
116 . . . Kikuchi pattern caused by t-EBSD
117 . . . Kikuchi line
118 . . . another crystalline phase
119 . . . included non-crystalline particle-like observation target phase
120 . . . Kikuchi line of another crystalline phase
121 . . . Kikuchi line of observation target phase
122 . . . plotted part of strength profile
123 . . . strength profile
124 . . . distance axis
125 . . . strength axis
126 . . . peak height
127 . . . noise height
128 . . . half-value width
129 . . . FIB-SEM
130 . . . SEM housing
131 . . . electron beam axis
132 . . . FIB housing
133 . . . ion beam axis
134 . . . secondary electron detector
135 . . . sample chamber
136 . . . computer
137 . . . monitor
138 . . . controller (keyboard, mouse, or the like)
139 . . . EBSD detector
140 . . . EDX detector
141 . . . BSE detector
142 . . . transmission electron detector

The invention claimed is:

1. A sample processing method of processing a sample including at least two phases, at least one of the at least two phases including a structure serving as an observation target, the sample processing method comprising:
   a step of performing, by using an ion beam, ion milling on a phase on a back surface of the sample facing a front surface of the sample serving as an electron beam irradiation surface of the sample, the phase being different from the phase including the structure serving as the observation target; and a step of determining a processing end point on the back surface of the sample on the basis of a strength of an interference image of an electron diffraction wave generated from the back surface of the sample by, after performing ion milling on the back surface of the sample, irradiating the front surface of the sample with an electron beam and transmitting the electron beam through the sample;

wherein at least two or more parameters of a peak height, a signal/noise ratio, and a half-value width of a line profile of the strength of the interference image of the electron diffraction wave emitted from the back surface of the sample are selected, and the processing end point on the back surface of the sample is determined on the basis of a change in the selected parameters.

2. The sample processing method according to claim 1, wherein a depth of ion milling in the phase different from the phase including the structure serving as the observation target is determined on the basis of an entering depth of the electron beam obtained when, before ion milling, the sample is irradiated with the electron beam and an image of the structure is obtained.

3. The sample processing method according to claim 1, wherein an irradiation direction of the ion beam and an injection direction of the electron beam intersect with each other, and an angle between the irradiation direction of the ion beam and the injection direction of the electron beam is 20 to 60°.

4. The sample processing method according to claim 3, wherein the angle between the irradiation direction of the ion beam and the injection direction of the electron beam is 40°.

5. The sample processing method according to claim 1, wherein a point of time at which it is determined that the strength of the interference image of the electron diffraction wave emitted from the back surface of the sample has been saturated is determined as the processing end point on the back surface.

6. The sample processing method according to claim 1, wherein:

the sample is a sample in which a crystalline phase includes a non-crystalline structure; and a point of time at which the interference image of the electron diffraction wave emitted from the back surface of the sample disappears is determined as the processing end point on the back surface of the sample.

7. The sample processing method according to claim 1, wherein:

the sample is a sample in which a phase having a first crystallinity includes a structure having a second crystallinity different from the first crystallinity; and a point of time at which the interference image of the electron diffraction wave emitted from the back surface of the sample is confirmed to be an interference image of a planned material is determined as the processing end point on the back surface of the sample.

8. The sample processing method according to claim 1, wherein interference images of electron diffraction waves emitted from the back surface of the sample, the interference images being interference images of the electron diffraction waves in a plurality of thicknesses of the sample, are acquired in advance and the interference images acquired in advance in the plurality of thicknesses are compared with an interference image of an electron diffraction wave emitted from the back surface of the sample, the interference image being obtained when the sample is actually processed, and a point of time at which the interference images are matched is determined as the processing end point on the back surface of the sample.

9. The sample processing method according to claim 1, wherein interference images of electron diffraction waves emitted from the back surface of the sample, the interference images being interference images of the electron diffraction waves in a plurality of thicknesses of the sample, are obtained by calculation using Monte Carlo simulation and the interference images obtained by calculation in advance in the plurality of thicknesses are compared with an interference image of an electron diffraction wave emitted from the back surface of the sample, the interference image being obtained when the sample is actually processed, and a point of time at which the interference images are matched is determined as the processing end point on the back surface of the sample.

10. A charged particle beam device for processing a sample including at least two phases, at least one of the at least two phases including a structure serving as an observation target, the charged particle beam device comprising:

a SEM housing configured to scan the sample with an electron beam, the SEM housing including an electron source, an electron acceleration unit, an electron focusing lens, and an electron beam scanning mechanism;

a FIB housing configured to irradiate, with an ion beam, a back surface of the sample facing a front surface of the sample serving as an electron beam irradiation surface of the sample and perform ion milling on a phase different from the phase including the structure, the FIB housing including an ion source, an ion acceleration unit, an ion focusing lens, and an ion beam scanning mechanism;

a transmission back-scattered electron diffraction wave detector configured to detect an electron diffraction wave generated from the back surface of the sample by transmitting the electron beam through the sample, the transmission back-scattered electron diffraction wave detector being placed below the back surface of the sample; and a computer configured to generate an interference image of the electron diffraction wave on the basis of the electron diffraction wave detected by the transmission back-scattered electron diffraction wave detector, wherein the computer determines a processing end point on the back surface of the sample on the basis of a strength of the interference image of the electron diffraction wave, and at least two or more parameters of a peak height, a signal/noise ratio, and a half-value width of a line profile of the strength of the interference image of the electron diffraction wave emitted from the back surface of the sample are selected, and the processing end point on the back surface of the sample is determined on the basis of a change in the selected parameters.

11. The charged particle beam device according to claim 10, wherein the SEM housing and the FIB housing are placed so that an axis of the electron beam and an axis of the ion beam intersect with each other in the vicinity of the sample.

12. The charged particle beam device according to claim 10, further comprising
at least one or more of a detector configured to detect back-scattered electrons emitted from the front surface of the sample, a detector configured to detect a characteristic X-ray emitted from the front surface of the sample, a detector configured to detect a back-scattered electron diffraction wave emitted from the front surface of the sample, and a detector configured to detect transmission electrons transmitted through the sample.

13. The charged particle beam device according to claim 10, wherein
the computer measures the strength of the interference image of the electron diffraction wave emitted from the back surface of the sample and specifies a sample film thickness associated in advance with the strength of the interference image of the electron diffraction wave.

* * * * *